United States Patent
Arbogast et al.

(10) Patent No.: US 6,795,314 B1
(45) Date of Patent: Sep. 21, 2004

(54) REMOVABLE FAN MODULE AND ELECTRONIC DEVICE INCORPORATING SAME

(75) Inventors: Porter Arbogast, Fort Collins, CO (US); Arlen L. Roesner, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/396,535

(22) Filed: Mar. 25, 2003

(51) Int. Cl.$^7$ ................................................ H05K 7/20
(52) U.S. Cl. ...................... 361/695; 361/697; 174/16.1; 165/104.33; 165/122; 454/184
(58) Field of Search ................................ 361/690–695, 361/704, 719–721; 174/16.1, 16.3; 165/80.2, 80.3, 104.33; 454/184

(56) References Cited

U.S. PATENT DOCUMENTS

| | | | |
|---|---|---|---|
| 4,356,531 A | 10/1982 | Marino et al. | |
| 4,728,160 A | 3/1988 | Mondor et al. | |
| 4,739,445 A | 4/1988 | Tragen | |
| D297,455 S | 8/1988 | Goldfarb et al. | |
| 5,208,730 A | 5/1993 | Tracy | |
| 5,613,906 A | 3/1997 | Kikinis | |
| 5,717,570 A | 2/1998 | Kikinis | |
| 5,831,525 A | 11/1998 | Harvey | |
| 5,936,836 A | 8/1999 | Scholder | |
| 5,949,646 A | 9/1999 | Lee et al. | |
| 6,058,009 A | 5/2000 | Hood, III et al. | |
| 6,069,792 A | 5/2000 | Nelik | |
| 6,075,698 A * | 6/2000 | Hogan et al. | 361/695 |
| 6,094,345 A | 7/2000 | Diemunsch | |
| 6,101,459 A | 8/2000 | Tavallaei et al. | |
| 6,176,299 B1 | 1/2001 | Hanzlik et al. | |
| 6,244,953 B1 * | 6/2001 | Dugan et al. | 454/184 |
| 6,288,898 B1 | 9/2001 | Johnson et al. | |
| 6,311,767 B1 | 11/2001 | Inoue et al. | |
| 6,313,988 B1 | 11/2001 | Pham | |
| 6,373,698 B1 * | 4/2002 | Christensen | 361/695 |
| 6,375,440 B2 * | 4/2002 | Kosugi | 417/423.14 |
| 6,377,455 B1 | 4/2002 | Nelik | |
| 6,400,568 B1 * | 6/2002 | Kim et al. | 361/697 |
| 6,459,575 B1 | 10/2002 | Esterberg | |
| 6,587,342 B1 * | 7/2003 | Hsu | 361/695 |
| 6,663,416 B2 * | 12/2003 | Huang et al. | 439/485 |
| 6,674,641 B2 * | 1/2004 | Jensen et al. | 361/687 |

* cited by examiner

*Primary Examiner*—Boris Chervinsky

(57) ABSTRACT

A removable fan module is featured. The removable fan module comprises a first member securable to a fan. The first member comprises a portion adapted to engage a corresponding portion of an electrical device. An electronic device also is featured. The electronic device comprises a plurality of removable fan modules. At least one of the plurality of removable fan modules has a first type of fan and at least one of the plurality of removable fan modules has a second type of fan. The removable fan module comprises a fan retainer securable to the first and second type of fan. A portion of the electronic device and the fan retainer are adapted to enable the fan retainer to be received by the electronic device.

24 Claims, 6 Drawing Sheets

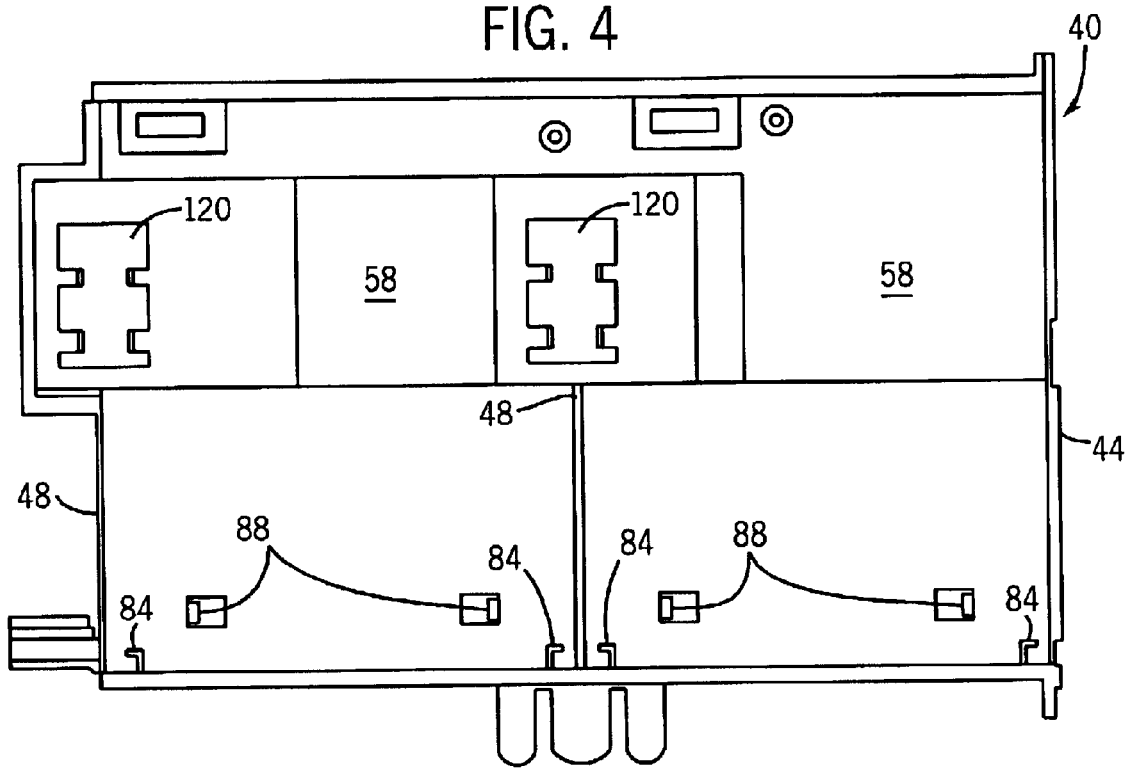

REMOVABLE FAN MODULE AND ELECTRONIC DEVICE INCORPORATING SAME

BACKGROUND OF THE INVENTION

Electronic devices typically generate heat during operation due to the flow of electricity through the device. Some electronic components are susceptible to damage if this heat is not removed. Consequently, various methods have been developed to remove heat from within electronic devices and/or electronic components. Passive methods use natural convection to remove heat. For example, the electronic device may have a housing with vents to let cool air flow into the device and hot air flow out. Other electronic devices use active methods, such as electric fans built into the housing, to provide a flow of cooling air through the device.

The processors in many processor-based devices are susceptible to heat damage. Consequently, at least one cooling fan usually is needed to remove the heat from the processor to prevent the processor from being damaged. For example, a typical home computer has a cooling fan to remove the heat produced by the electronic components, including the processor, housed therein. In other computer systems, several fans may be used to remove heat from within the device. In mission critical systems, such as servers, redundant fans may be provided that are operable to respond when another fan fails, either by initiating operation or by increasing speed Several different sizes and types of fans may be used in electronic devices, such as processor-based devices. Unfortunately, each type of fan typically requires its own unique method of installation. In addition, the securing methods may involve numerous parts, such as threaded fasteners. Furthermore, these fans typically are bulky and may not be disposed in a space-efficient side-by-side arrangement. Alternatively, fan connectors and finger guards may be oriented in such a manner that they interfere with the flow of air through the fan or otherwise add to the difficulty of installing the fan.

SUMMARY

According to an embodiment of the present invention, a removable fan module is featured. The removable fan module comprises a first member securable to a fan. The first member comprises a portion adapted to engage a corresponding portion of an electrical device.

According to another embodiment of the present invention, an electronic device is featured. The electronic device comprises a plurality of removable fan modules. At least one of the plurality of removable fan modules having a first type of fan and at least one of the plurality of removable fan modules having a second type of fan. The removable fan module comprises a fan retainer securable to the first and second type of fan. A portion of the electronic device and the fan retainer are adapted to enable the fan retainer to be received by the electronic device.

According to another embodiment of the present invention, a method of removably securing a plurality of fans within an electronic device is featured. The method comprises securing a common fan retainer to at least one of the plurality of fans, the common fan retainer being operable to secure the at least one of plurality of fans to the electronic device. The method comprises disposing the fans and common fan retainers within the electronic device to secure the plurality of fans to the electronic device.

BRIEF DESCRIPTION OF THE DRAWINGS

Exemplary embodiments will hereafter be described with reference to the accompanying drawings, wherein like reference numerals denote like elements, and:

FIG. 3 is a perspective view of a first removable fan of FIG. 2;

FIG. 4 is a top view of a portion of the chassis of the processor-based system of FIG. 2;

DETAILED DESCRIPTION

Figure 1:
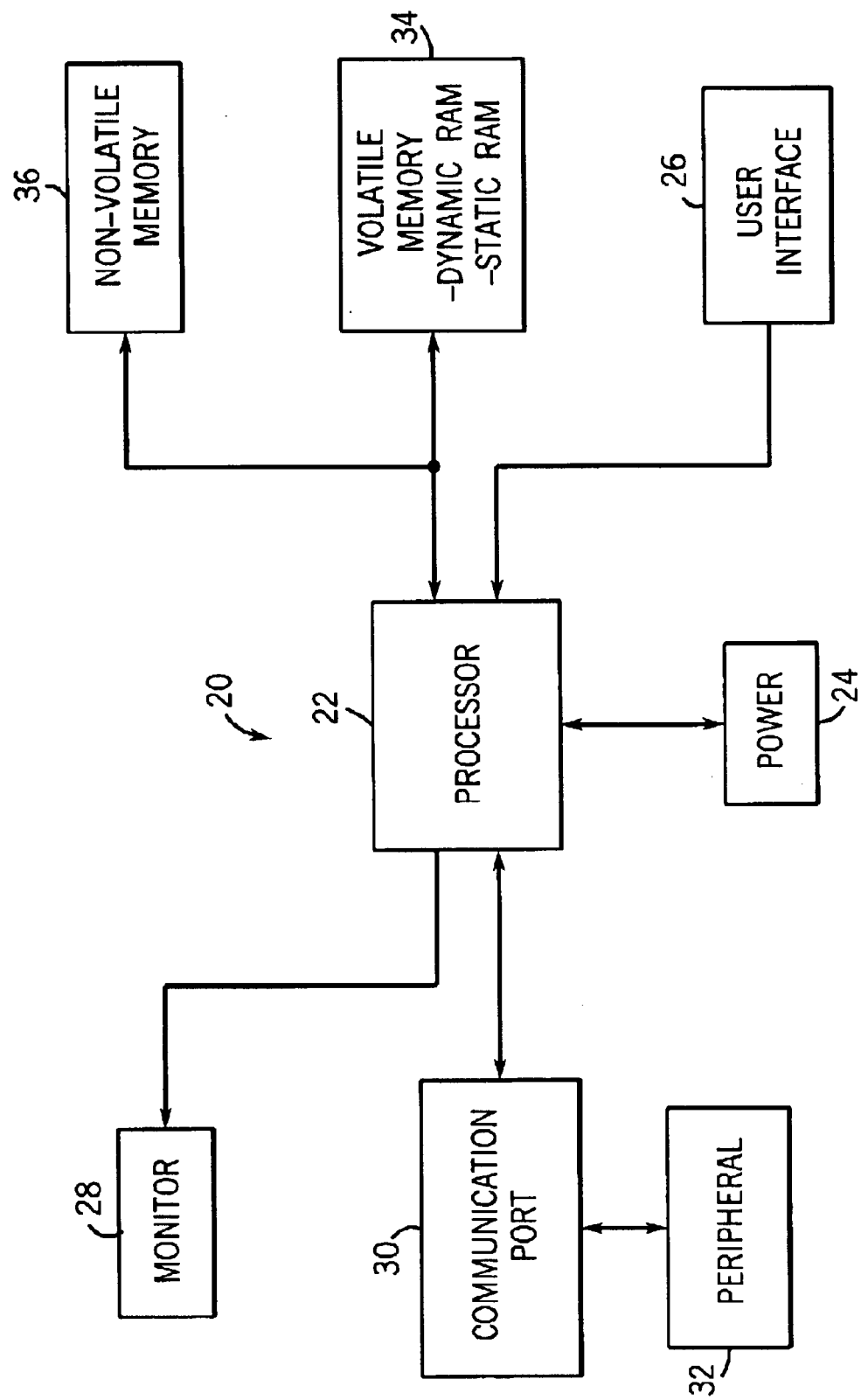
FIG. 1 illustrates a block-diagram of a processor-based system according to an embodiment of the present invention.

Referring generally to FIG. 1, a block diagram is illustrated depicting an exemplary processor-based device, generally designated by reference numeral 20. The processor-based device 20 may be any of a variety of different devices, such as a personal computer or a server.

The illustrated processor-based device 20 uses a processor 22 to control the operation of device 20. Processor 22 may be a microprocessor, such as used in a personal computer, or other type of processor. Processor-based device 22 has a power supply 24 to supply power to the other components of the system. Various additional components of system 20 may be coupled to processor 22. For instance, a user interface 26 may be coupled to processor 22 to allow an-operator to control some or all of the functions of the device. Examples of user interfaces include a keyboard, a mouse, or a joystick. A monitor 28 may be coupled to the processor 22 to allow an operator to view visual information provided by the device. This information may be displayed on the monitor via a graphical user interface. A communications port 30 also may be used to couple processor 22 to peripheral devices 32, such as a modem or printer.

Programming instructions are often used to control the operation of processor 22 and these programming instructions are typically stored in electronic memory. There are several different types of electronic memory available for use in processor-based devices. For example, the processor 22 may be coupled to volatile memory 34. Volatile memory may include dynamic random access memory (DRAM) and/or static random access memory (SRAM) packaged, for example, as a single-inline memory module (SIMM) or as a dual-inline memory module (DIMM). Processor 22 also may be coupled to non-volatile memory 36. Non-volatile memory 36 may include a read only memory (ROM), such as an erasable programmable read-only memory (EPROM), to be used in conjunction with the volatile memory. The non-volatile memory 36 may include a high capacity memory such as a hard disk drive (HDD) or tape drive memory.

Figure 2:
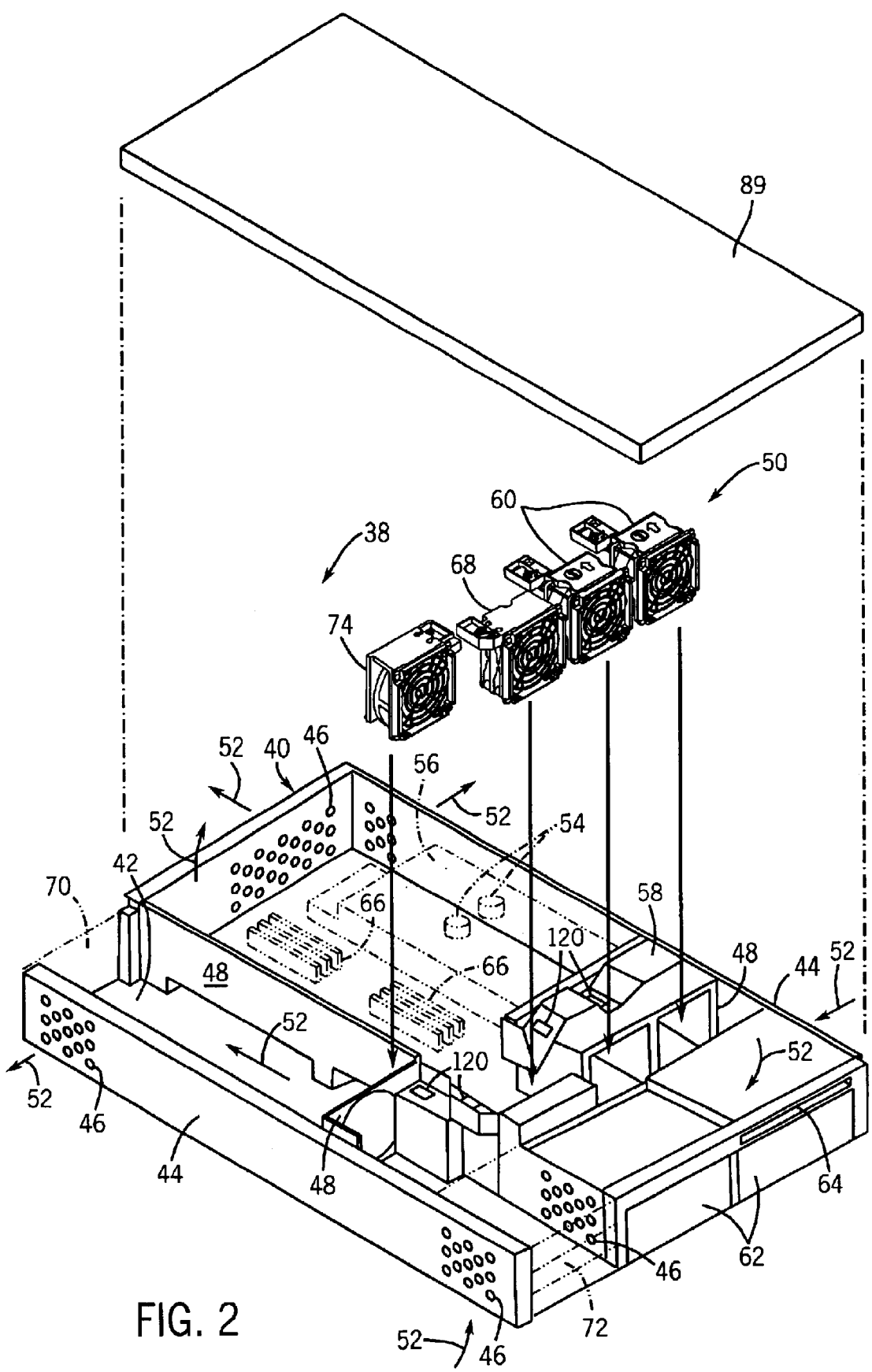
FIG. 2 is a perspective view illustrating an embodiment of a processor-based system, in accordance with an embodiment of the present invention.
Figure 5:
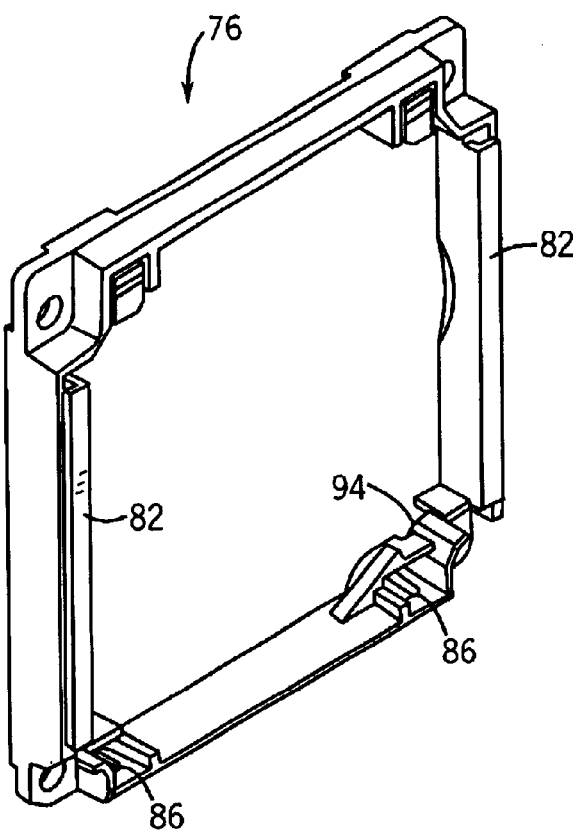
FIG. 5 is a front perspective view of a fan retainer illustrated in FIG. 3.
Figure 6:
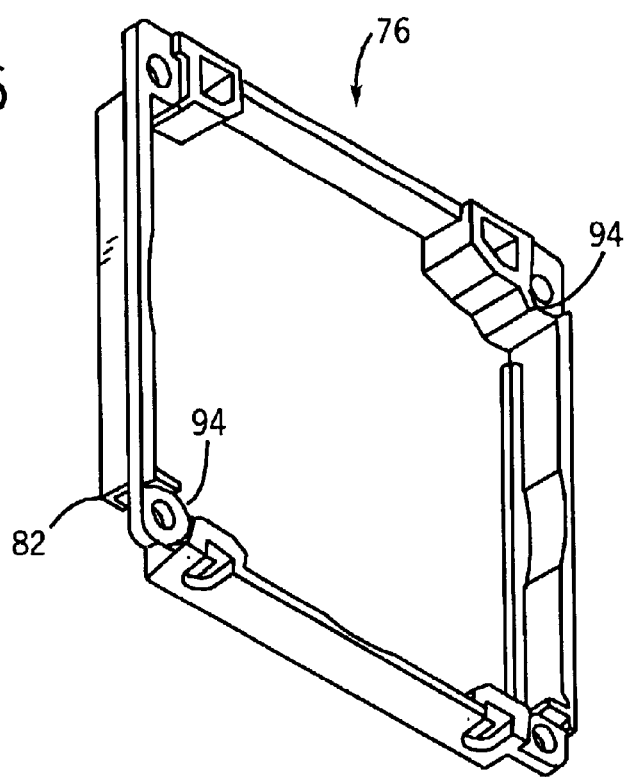
FIG. 6 is a rear perspective view of the fan retainer of FIG. 5.

Referring generally to FIG. 2, an embodiment of a processor-based device 38 is illustrated. In this embodiment, processor-based device 38 is a server and comprises a chassis 40 and a number of electronic components housed within chassis 40. Chassis 40 may comprise sheet metal, or other materials may be used. In this embodiment, chassis 40 comprises a base 42 having sides 44. A number of ventilation holes 46 are provided in chassis 40. Chassis 40 also has a plurality of dividers 48 secured to base 42 that are used to separate various portions of the chassis and to secure components to base 42. In the illustrated embodiment, dividers 48 comprise folded sheet metal. However, other materials also may be used to construct dividers 48.

Several removable fans 50 are provided to produce a flow of air 52 through device 38 to cool the components housed therein. In this embodiment, three different types of fan are utilized. However, fans of the same type or fans of other types may be used. In addition, fans 50 can have a variety of different dimensions. Ventilation holes 46 are oriented at each end of base 44 and the cover so that air 52 is drawn in at one end of the device and exited at the opposite end. However, other orientations of ventilation holes 46 may be used. Dividers 48 also may be used to guide the flow of air 52 through device 38.

In the illustrated embodiment, processor-based device 38 has a pair of processors 54. A cover 56 is disposed over processors 54 to guide air 52 over the processors 54. In addition, ducts 58 are provided to guide air 52 into cover 56. In this embodiment, two fan modules 60 of the plurality of fans 50 primarily are used to provide a flow of air 52 to cool processors 54. Several different operating strategies may be used to operate fan modules 60. In one strategy, both fan modules are operated at low speed. If one of the fan modules fails, then the speed of the other fan module is increased to compensate for the loss of the failed fan. Alternatively, only one fan module at a time may be operated. If the operating fan fails, then the non-operating fan is turned on to maintain the flow of air 52. The flow of air 52 provided by fan modules 60 may cool other components located within the device 38, such as power supplies 62 and optical drive 64. In addition, other fan modules may assist in the cooling of the processors 54.

In this embodiment, processor-based device 38 also comprises a plurality of DIMM's 66. However, other memory modules may be used. Also, a second fan module 68 primarily is utilized to provide a flow of air 52 to cool the DIMM's.

Processor-based device 38 may also comprise a PCI cage 70. PCI cage 70 houses a number of interface cards for connecting processor-based device 38 to an electronic communication system. Processor-based device 38 also comprises several HDDs 72. A flow of air 52 for cooling the components within PCI cage 70 and the HDDs 72 is provided primarily by a third fan module 74. However, third fan module 74 also may be used to cool other components and other fan modules may assist in the cooling of the components within PCI cage 70 and HDDs 72.

In the illustrated embodiment, fan modules 60, second fan module 68, and third fan module 74 are hot-swap fans, i.e., these fans may be installed and removed without securing power to, or interrupting operation of, processor-based device 38. Redundant fans are provided so that if one of the fans fails, operation of the device may continue until a replacement fan is installed. In addition, each fan is adapted to be blind-mated to a corresponding connector within chassis 40 when the fan is installed within device 38. Also, each fan receives power through the connectors, and fan operation, such as fan speed, may be controlled via signals transmitted via the connectors.

The plurality of fans 50 utilize a common methodology for removably installing the fans within the chassis 40. The common methodology enables installation and removal without the use of fasteners or tools. In addition, the common methodology enables fans of different dimensions to be installed with common components.

Referring generally to FIGS. 2–6, the illustrated fan module 60 comprises a fan retainer 76, a first fan 78, and a Fan top piece 80. Fan retainer 76 comprises a pair of mating flanges 82 adapted to slidingly engage a pair of catching flanges 84 located on a divider 48 secured to chassis 40 (See FIG. 4). Fan retainer 76 is utilized with all three types of fans described with respect to the illustrated embodiment. In this embodiment, fan retainer 76 comprises a plastic material. Fan retainer 76 also comprises a pair of alignment notches 86 adapted to engage corresponding alignment tabs 88 located on base 42 of chassis 40 when there is proper alignment between fan module 60 and chassis 40 (See FIG. 4). Alignment tabs 88 prevent a fan module from being fully inserted when there is misalignment between the fan module and chassis 40, thereby indicating misalignment to an installer. Fan modules are blocked from removal from chassis 40 by a cover 89.

Referring generally to FIG. 3, fan module 60 may be adapted to accommodate a fan 78. Fan 78 comprises a rotatable fan blade 90 driven by an electric motor and a fixed air guide downstream of rotatable fan blade 90. A finger guard 92 is disposed on each end of fan module 60 to prevent a finger from contacting fan blade 90. Fan retainer 76 may have a recess 94 on each corner. Each recess 94 is adapted to receive a portion of a finger guard 92 to secure finger guard 92 to fan retainer 76. In this embodiment, fan retainer 76 is secured to fan 78 by a plurality of rivets 98. However, other fasteners may be used.

Fan top piece 80 is adapted to electrically couple fan module 60 to a fan power system within processor-based device 38. Fan top piece 80 is secured to fan module 60 by a tongue 100 that engages a slot in fan retainer 76 and by a plurality of rivets 102 secured to fan 78 through the fan top piece 80. However, other types of fasteners may be used. Fan top piece 80 also has a pair of finger grips 104 to facilitate gripping of fan module 60. Fan top piece 80 also has an identifier 106 to indicate that this is a specific type of fan: in the illustrated embodiment a Type 1 fan.

Fan module 60 has an inlet side 108 and an outlet side 110. An arrow 112 is provided on fan top piece 80 to indicate the flow of air from the inlet side 108 to the outlet side 110. In this embodiment, fan retainer 76 is disposed on the inlet side 108 of the fan. Alternatively, fan retainer 76 may be disposed on the outlet side 110 of the fan.

The illustrated embodiment of fan top piece 80 has a connector portion 114 housing a first electrical connector 116. Connector 116 is coupled by power and control leads 118 to the motor of fan module 60.

Connector portion 114 forms a protective tray to protect power and control leads 118. Where each fan module 60 is to be installed within chassis 40, catching flanges 84 and a second electrical connector 120 are oriented within the chassis 40 to enable the first and second electrical connectors to be blind-mated when the first fan module 60 is inserted.

Referring again to FIGS. 2–4, as fan module 60 is guided into chassis 40 by the mating flanges 82 and catching flanges 84, first electrical connector 116 is guided into engagement with second electrical connector 120. In this embodiment, connector portion 114 of fan top portion 80 is cantilevered to displace first electrical connector 116 axially and in line with airflow through fan module 60. This displacement enables two fan modules 60 to be installed within chassis 40 so that fans 78 are in close, side-by-side arrangement, as illustrated in FIG. 4. In one embodiment, fans 78 are disposed approximately 1.5 mm from each other. As discussed above, alignment notches 86 and alignment tabs 88 facilitate the blind-mating of each fan module by preventing the fan module from being fully inserted when there is a misalignment between the fan module and chassis 40.

Figure 7:
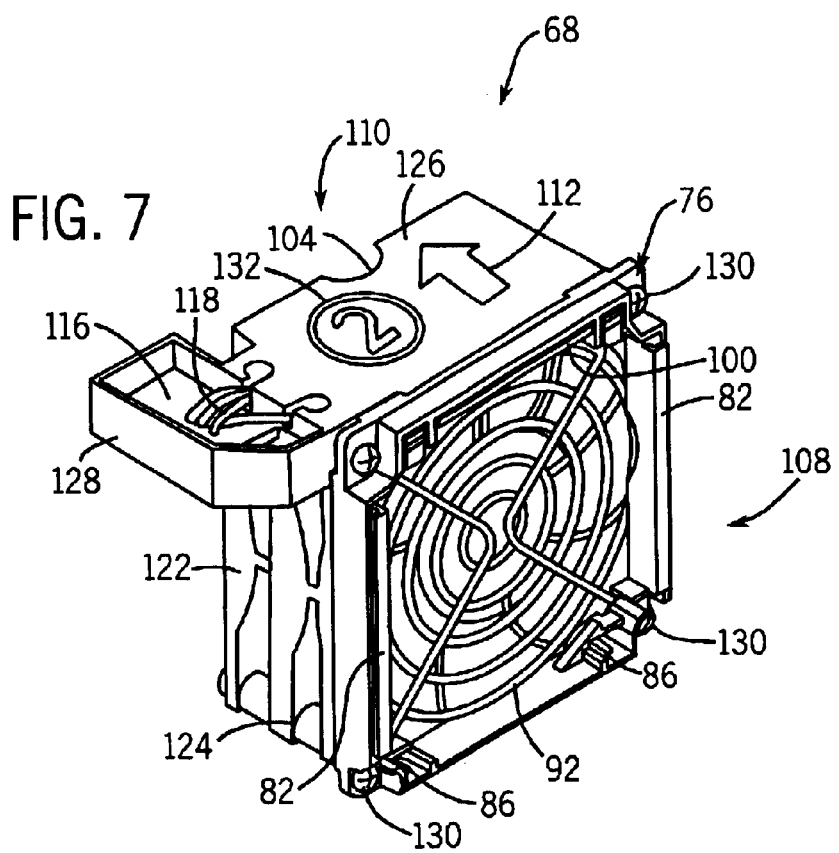
FIG. 7 is a perspective view of a second removable fan of FIG. 2.

Referring generally to FIG. 7, second fan module 68 is illustrated. Second fan module 68 comprises a fan retainer 76, a fan 122, a fan 124, and a second fan top piece 126. Fan 122 and fan 124 each house a motor and fan blade. Second fan module 68 also may be used with a single fan having the same depth as fans 122 and 124 when placed together. Several different operating strategies also may be employed to operate fans 122 and 124. For example, both fans may be operated at a low speed. If one of the fans fails, then the speed of the other fan is increased to compensate for the loss of the failed fan. Alternatively, only one fan at a time may be operated. If the operating fan fails, then the non-operating fan is turned on to maintain the flow of air 52.

Second fan top piece 126 is configured for use with second fan module 68. Second fan top piece 126 also is adapted with a connector portion 128. Connector portion 128 houses a first electrical connector 116 coupled by power and control leads 118 to the motors within second fans 122 and 124. Connector portion 128 of second fan top piece 126 displaces first electrical connector 116 to the side of second fan module 68, and transverse to the direction of airflow therethrough. Catching flanges 84 and second electrical connector 120 are oriented within the chassis 40 to connect the first and second electrical connectors when second fan module 68 is fully inserted into chassis 40. As second fan module 68 is guided into chassis 40 by the mating flanges 82 and catching flanges 84, first electrical connector 116 is guided into engagement with second electrical connector 120.

A plurality of fasteners 130 are employed to secure fan retainer 76, fan 122, fan 124, and second fan top piece 126 together. Second fan top piece 126 also has tongue 100 adapted to extend under a portion of fan retainer 76. In this embodiment, second fan top piece 126 also has an identifier 132 to indicate the fan module type as a Type 2 fan. Second fan module 68 also has an inlet side 108 and an outlet side 110. An arrow 112 is provided on Second fan top piece 126 to indicate the direction of airflow from the inlet side 108 to the outlet side 110. In this embodiment, fan retainer 76 is disposed on the inlet side 108 of the second-type fan module 68. Alternatively, fan retainer 76 may be disposed on the outlet side lo of fan module 68.

Figure 8:
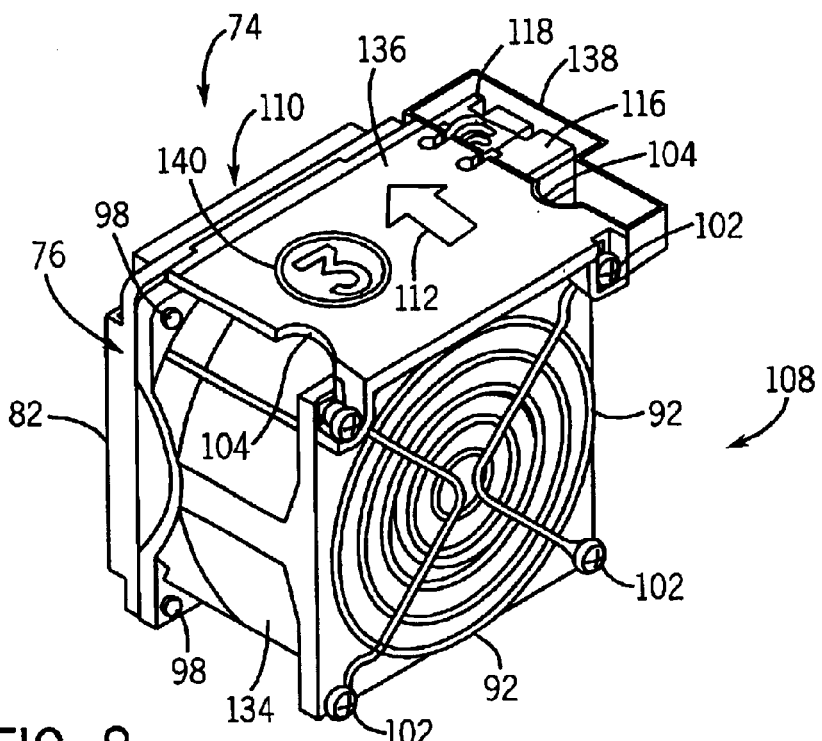
FIG. 8 is a perspective view of a third removable fan of FIG. 2.

Referring generally to FIG. 8, third fan module 74 is illustrated. Third fan module 74 comprises a fan retainer 76, a fan 134, and a third fan top piece 136. In the illustrated embodiment, fan 134 has two counter-rotating fan impellers. Third fan module 74 also may be used with two fans having half the width of third fan 134, etc.

Third fan top piece 136 is configured for use with third-type fan module 74. Third fan top piece 136 has a connector portion 138 housing a male electrical connector 116 coupled by power and control leads 118 to the motor within fan housing 134. Connector portion 138 is adapted to enable first electrical connector 116 to be blind-mated with a corresponding second electrical connector 120 located on chassis 40. As third fan module 74 is guided into chassis 40 by the mating flanges 82 and catching flanges 84, the first electrical connector 116 is guided into engagement with second electrical connector 120.

In this embodiment, third fan top piece 136 also has an identifier 140 to indicate that this is a Type 3 fan. Third fan module 74 has an inlet side 108 and an outlet side 110. An arrow 112 is provided on fan top portion 136 to indicate the direction of airflow from the inlet side 108 to the outlet side 110. In this embodiment, fan retainer 76 is disposed on the outlet side 110 of the second-type fan module 68. Alternatively, fan retainer 76 may be disposed on the inlet side 108 of fan module 68.

Figure 9:
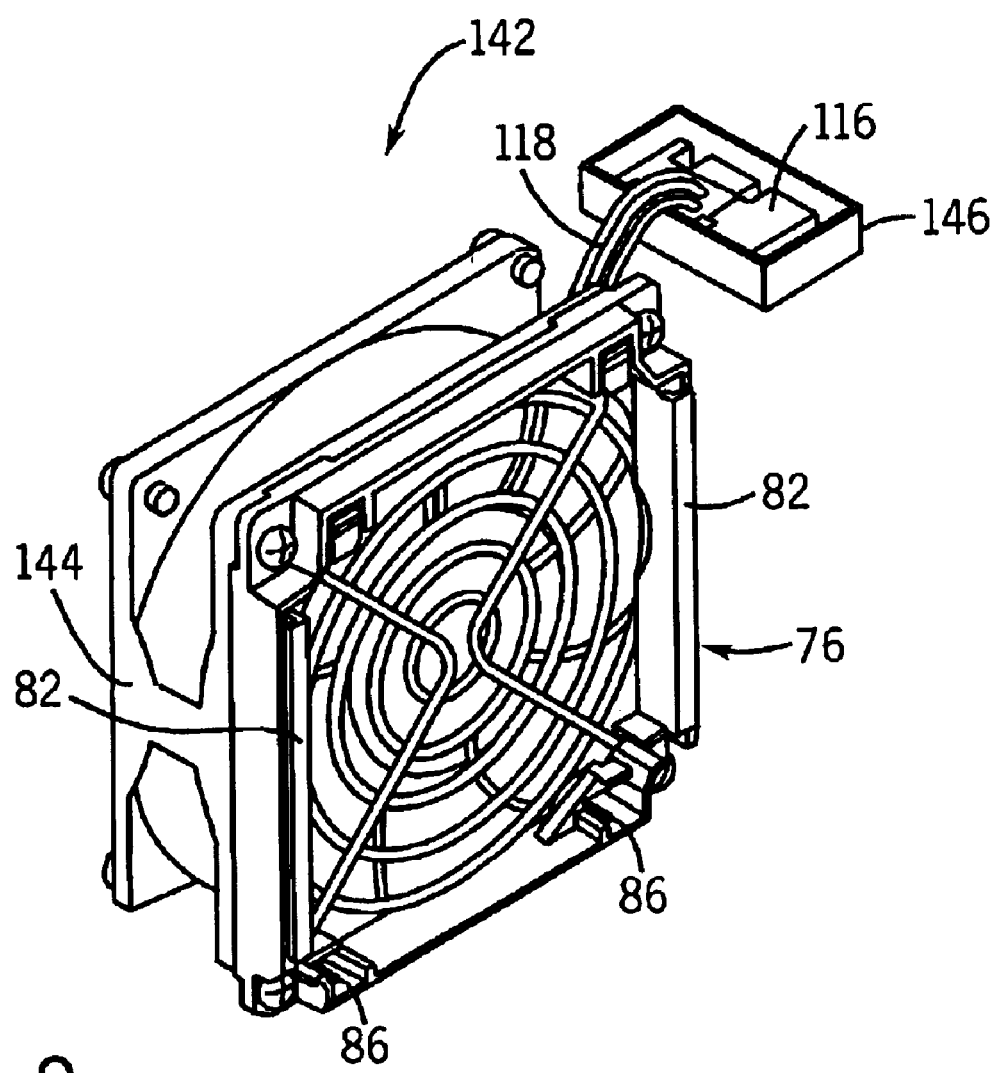
FIG. 9 is a perspective view of a fourth removable fan, in accordance with an alternative embodiment of the present invention.

Referring generally to FIG. 9, a fourth fan module 142 is illustrated. In this embodiment, fourth fan module 142 is a non-hot swap fan module. Fourth fan module 142 comprises a fan retainer 76, a fourth fan 144, and a separate connector-146 connected by power and control leads 118 to the motor within fourth fan 144. Fourth fan module 142 may be used instead of, or to replace, some or all of the plurality of fan modules 50. For example, fourth fan modules 142 may be used to replace fan modules 60 in processor-based device 38. In addition, fourth fan modules 142 may be used in devices where non-redundant, i.e. non-hot swap fans are employed. For example, hot swap fans typically are not required in a workstation. Thus, the same methodology for securing removable cooling fans may be used in systems that require hot swap fans and those systems, such as workstations, that do not. In addition, the above techniques may be used to secure cooling fans in rack-mounted systems, such as servers, and desktop systems, such as workstations.

While the subject matter may be susceptible to various modifications and alternative forms, specific embodiments have been shown by way of example in the drawings and will be described in detail herein. However, it should be understood that the subject matter is not intended to be limited to the particular forms disclosed. Rather, the subject matter is to cover all modifications, equivalents and alternatives falling within the spirit and scope of the subject matter as defined by the following appended claims.

What is claimed is:

1. A removable fan module, comprising:
   a first member securable to a fan, the first member comprising a flanged portion adapted to slidingly engage a corresponding flanged portion of an electrical device; and
   a second member securable to a fan, the second member adapted to house a first electrical connector adapted to matingly engage a second electrical connector disposed within the electronic device when the fan module is disposed within the electrical device.

2. The removable fan module as recited in claim 1, comprising the fan.

3. The removable fan module as recited in claim 1, wherein the second member comprises a cantilevered portion adapted to house the first electrical connector.

4. The removable fan module as recited in claim 1, wherein the second member displaces the first electrical connector relative to the fan to enable fans of two adjacent fan modules to be disposed in a side-by-side arrangement.

5. The removable fan module as recited in claim 1, comprising a finger guard, wherein the first member is adapted to capture the finger guard.

6. The removable fan module as recited in claim 1, wherein the first member comprises an alignment portion adapted to cooperate with a corresponding alignment portion within the electrical device to provide an indication of misalignment between the removable fan module and the electrical device.

7. The removable fan module as recited in claim 1, wherein the first member is operable to secure a type of fan having at least one rotatable fan blade and a fixed air guide to the electrical device.

8. The removable fan module as recited in claim 1, wherein the first member is operable to secure a type of fan having counter-rotatable impellers.

9. The removable fan module as recited in claim 1, wherein the first member is operable to be selectively secured to an inlet side and an outlet side of the fan.

10. An electronic device, comprising:
a plurality of removable fan modules, at least one of the plurality of removable fan modules having a first type of fan and at least one of the plurality of removable fan modules having a second type of fan; and
a common fan retainer securable to the first and second type of fan; and
a chassis adapted to receive the plurality of removable fan modules, the chassis and the common fan retainer adapted to cooperate to secure each of the plurality of removable fan modules to the chassis.

11. The electronic device as recited in claim 10, wherein the common fan retainer and the chassis are adapted to enable the chassis to receive each common fan retainer in sliding mating engagement.

12. The electronic device as recited in claim 10, wherein the common fan retainer comprises a pair of flanges and the chassis comprises a plurality of pairs of corresponding flanges.

13. The electronic device as recited in claim 10, wherein the common fan retainer comprises an alignment portion adapted to cooperate a corresponding portion of the chassis to indicate when there is alignment between at least one of the plurality of removable fan modules and the chassis.

14. The electronic device as recited in claim 10, wherein at least one of the plurality of removable fan modules comprises an electrical connector adapted to blind-mate with a corresponding electrical connector secured to the chassis.

15. The electronic device as recited in claim 10, wherein the electrical connector for at least one of the plurality of removable fan modules is displaced differently in relation to at least one other electrical connector for at least one other of the plurality of removable fan modules.

16. The electronic device as recited in claim 14, wherein the electrical connector is cantilevered axially relative to the direction of airflow through the fan.

17. The electronic device as recited in claim 14, wherein the electrical connector is cantilevered transversely relative to the direction of airflow through the fan.

18. The electronic device as recited in claim 10, wherein at least one of the plurality of removable fan modules is adapted to be removed without interrupting operation of the electrical device.

19. The electronic device as recited in claim 10, wherein the first type of fan is of a different dimension than the second type of fan.

20. A method of removably securing a plurality of fans within an electronic device, comprising:
securing a common fan retainer to at least one of the plurality of fans, the common fan retainer being operable to secure the at least one of the plurality of fans to the electronic device; and
disposing the plurality of fans and common fan retainers within the electronic device to secure the plurality of fans to the electronic device.

21. The method as recited in claim 20, wherein disposing comprises slidingly engaging the common fan retainer with a corresponding portion of the electronic device.

22. The method as recited in claim 20, comprising blind-mating an electrical connector of at least one of the plurality of fans to a corresponding electrical connector of the electronic device.

23. An electrical device, comprising:
means for removably securing a plurality of fan-types within an electrical device.

24. The electrical device as recited in claim 23, wherein the means for removably securing comprises means for securing a common fan retainer to at least two of the plurality of fan-types.

* * * * *